United States Patent [19]
Brueck et al.

[11] Patent Number: 5,216,257
[45] Date of Patent: Jun. 1, 1993

[54] METHOD AND APPARATUS FOR ALIGNMENT AND OVERLAY OF SUBMICRON LITHOGRAPHIC FEATURES

[76] Inventors: Steven R. J. Brueck, 5601 Cometa Ct. NE., Albuquerque, N. Mex. 87111; Saleem H. Zaidi, 6020 Kathryn SE., Apt. #24, Albuquerque, N. Mex. 87108

[21] Appl. No.: 549,842

[22] Filed: Jul. 9, 1990

[51] Int. Cl.$^5$ .................. G01B 9/02; G01B 11/27
[52] U.S. Cl. ................ 250/548; 250/237 G; 356/401
[58] Field of Search .............. 250/237 G, 548; 356/363, 374, 401

[56] References Cited

U.S. PATENT DOCUMENTS

| | | | |
|---|---|---|---|
| 3,861,798 | 1/1975 | Kobayashi et al. | 356/363 |
| 3,867,038 | 2/1975 | Westell | 356/400 |
| 4,097,750 | 6/1978 | Lewis et al. | 250/548 |
| 4,200,395 | 4/1980 | Smith et al. | 356/363 |
| 4,371,264 | 2/1983 | Lacombat et al. | 356/363 |
| 4,664,524 | 5/1987 | Hattori et al. | 250/548 |

OTHER PUBLICATIONS

M. A. van den Brink, et al., SPIE 772, Optical Microlithography VI (1987), "Performance of a wafer stepper with automatic intra-die registration correction".
D. Post, Optical Engineering, May/Jun. 1982, vol. 21, No. 3, pp. 458-467, "Developments in moire interferometry".
F. M. Gerasimov, Applied Optics, vol. 6, No. 11, Nov. 1967, pp. 1861-1865, "Use of Diffraction Gratings for Controlling a Ruling Engine".

*Primary Examiner*—David C. Nelms
*Assistant Examiner*—S. Allen

[57] ABSTRACT

The method of measuring the relative between submicron lithographic features on a wafer having thereon a reference characteristic associated with a reference submicron grating structure of periodicity $p_1$ onto which there may be cast from a reticle the image of a projected submicron grating structure of different periodicity $p_2$ comprising measuring the extent of change in a moire fringe pattern produced by the superposition of the two grating structures on the wafer.

13 Claims, 4 Drawing Sheets

$p_{tran}=4.75\mu m$
$\theta_{cal}=4.1°$ $p_{tran}=2.0\mu m$
$\theta_{cal}=9.8°$ $p_{tran}=.95\mu m$
$\theta_{cal}=20.9°$ $p_{tran}=0.66\mu m$
$\theta_{cal}=30.66°$ Photoresist on Si
(p=340 nm, λ=488 nm)

ALIGNED

DISPLACED

METHOD AND APPARATUS FOR ALIGNMENT AND OVERLAY OF SUBMICRON LITHOGRAPHIC FEATURES

BACKGROUND

Feature dimensions in semiconductor menufacturing are continually becoming smaller. Present manufacturing processes are at roughly 0.8 μm. The next generation plans are to 0.5 μm followed by 0.35 μm within the next five years or so and are expected to reach about 0.15 μm critical dimensions (CD) thereafter. While substantial effort is being expended on lithographic techniques for producing these very small feature sizes, considerably less effort has been devoted to the equally important issues of alignment and overlay between mask levels. Generally, registration of two structures to within ⅛ to 1/5 of CD is required for successful manufacturing.

In connection with the present invention, the term "alignment" is used to refer to the process of assuring reticle-to-wafer registration when the wafer is in the exposure tool. The term "overlay" refers to after-exposure measure of how accurately the process was carried out. More generally, "overlay" may also refer to the overall success of registering full patterns of the two mask levels and not merely or only the alignment marks.

An important distinction between "alignnment" and "overlay" is one of time: "alignment" occurs in the stepper before the upper level exposure is carried out; "overlay" is a measure of success in the alignment process after the upper level has been exposed and developed.

Alignment and overlay measurement techniques have been identified in the industry as substantial problems which pose very substantial limits on the progress in developing future generations of integrated circuits.

Most alignment techniques are proprietary. An exception is the alignment system used by Phillips/ASM [Performance of a wafer stepper with automatic intra-die registration correction, M. A. van den Brink, S. Wittekoek, H. F. D. Linders, F. J. van Hout, and R. A. George, SPIE 772, Optical Microlithography VI (1987)]. In this technique, which forms the basis of the alignment technique implemented in Phillips/ASM steppers, an incident laser beam (HeNe laser at 633 nm) is diffracted from a phase grating on the wafer (16-μm period 400×80-μm² overall size) and imaged onto a second grating on the reticle. The intensity of the odd diffraction orders transmitted through the reticle, isolated by a spatial filter, is detected as the alignment signal.

Many other steppers rely on a small number of alignment marks, often in a nested L pattern that are imaged from the reticle to the wafer. It is important to emphasize that alignment will likely remain an electromagnetic process using optical or uv photons—and hence limited by diffraction effects.

Overlay measurement is often accomplished using a box-within-a-box technique. In this technique, a rectangular box on the reticle is exposed on a similar, but larger (or smaller) box on the wafer. Overlay is then measured by comparing the dimensions between the boxes on opposite sides, i.e., by measuring how well centerec the smaller box is inside the larger one. Provided both structures are uniform, this eliminates questions of edge definition as long as a consistent threshold is maintained. This technique depends on optical microscopy and is thus ultimately limited by the inevitable diffraction effects that become more severe as dimensions much less than a wavelength become important. See, for example, W. S. Ruska, Microelectronic Processing, McGraw-Hill, NY, 1987.

DESCRIPTION OF THE INVENTION

In accordance with the present invention moire patterns or fringes are employed to provide more accurate indications of overlay and alignment. Moire interferometry is well known and has been used in various metrological applications but only to a very limited extent at the submicrometer level. One example of use of moire patterns is the work described by F. M. Gerasimov in "Use of Diffraction Gratings for Controlling a Ruling Engine", Applied Optics, Vol. 6, No. 11, Nov. 1967, pp. 1861-1865 and more recently by D. Post in "Developments in moire interferometry", Optical Engineering, May/June 1982, Vol. 21, No. 3, pp. 458-467.

More particularly, according to the invention moire patterns are used to provide a very sensitive and simple technique for determining overlay of submicron patterns. This is done by providing a grating patterr for x and y axis displacement on the first mask layer. This pattern is oriented so that the submicrometer structures that form the mask level are referenced to a specific lire within this grating pattern, e.g. the central line of the grating. A grating with a slightly different period, chosen so that a small number of moire fringes fall within the dimensions of the alignment mark, is provided on the next mask level and is similarly aligned with the structures on the mask. Correct overlay will result in a moire fringe extrema, either a maximum or a minimum depending on the details of the lithography process, at the overlap position of the reference grating lines. Incorrect overlay (nonregistration) will shift or translate the extrema away from the correct position by distances much greater than the actual displacement or error between the two mask levels. The displacement of extrema is a multiple of the actual displacement and is thus more easily observed and measured.

It is easy to derive a simple relationship between the grating periods and the moire fringe pattern that simply illustrates this process. For two gratings of periods $p_1$ and $p_1+dp$, the moire fringe spacing $f_{diff}$ is simply given by $$1/f_{diff} = 1/p_1 - 1/(p_1+dp)$$

$$f_{diff} dp = p_1(p_1+dp) \sim p_1^2.$$

Thus the moire fringe spacing becomes larger as the difference between the two periods, dp, beromes smaller. However, the phase of the moire pattern clearly must vary by a full 2 pi as the underlying gratings are shifted by one period. Hence, the moire technique provides a dramatic spatial amplification which puts the resulting structure well within the range of optical or electron microscopy even for extreme submicrometer structures.

BRIEF DESCRIPTION OF THE DRAWINGS

Reference is now made to the drawings in which like reference numerals represent like parts and in which.

DETAILED DESCRIPTION OF THE INVENTION

Figure 1:
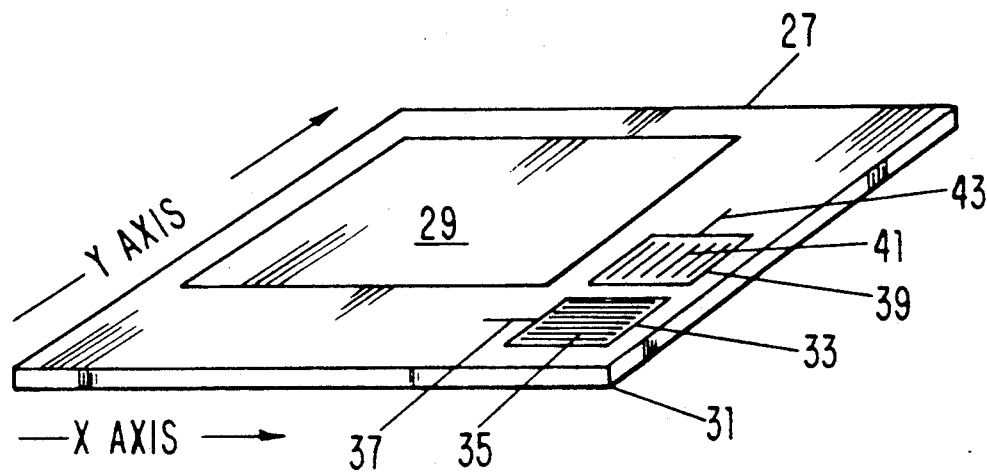
FIG. 1 is an illustration of an embodiment of the invention.
Figure 1:
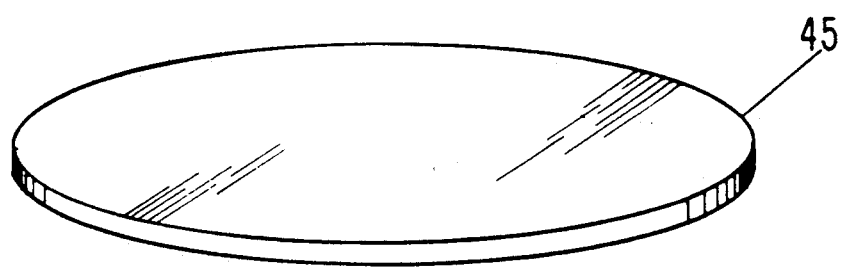
Figure 1:
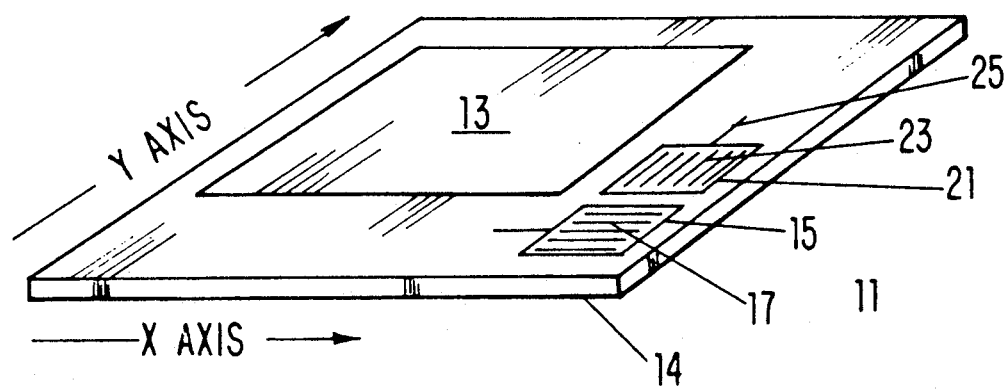

Referring to FIG. 1, there is shown a wafer or die 11 carrying microelectronic circuit structure 13. At any suitable location such as one corner 14 of the die or wafer 11 is located a first submicron grating structure 15 with its grating lines being parallel to the x-axis of the die as indicated. The grating structure 15 has a central grating line 17 with a marker or reference line 19 extending therefrom. A second submicron grating structure 21 is located adjacent the structure 15 with its grating lines parallel to the y-axis of the die 11 as indicated. The grating structure 21 has a central line grating 23 with a marker or reference line 25 extending therefrom. The purpose of the reference marker is to ensure that the lithographic structure that forms the circuit structure 13 are aligned with a specific line within the grating structure 15. Accordingly, the reference marker may be in any suitable location with fixed reference to the circuit lithography.

Located in proximity to the die or wafer 11 is a reticle 27 having a mask structure 29. The reticle 27 carries at a corner 31 thereof corresponding to the corner 14 of the die 11 a first submicron grating structure 33 with its grating lines parallel to the x-axis of the reticle 27 as indicated. The grating structure 33 has a central grating line 35 with a marker or reference line 37 extending therefrom. A second submicron grating structure 39 is located on the reticle 27 adjacent grating structure 33 and has grating lines parallel to the y axis of the reticle as indicated. The grating structure 39 has a central grating line 41 with a marker or reference line 43 extending therefrom.

A lens or other optics of any suitable well known design generally indicated by the reference numeral 45 may be disposed between the reticle 27 and the die 11. The optics 45 provide for adjustment of focus and further may be used to vary the period $p_1$ of the image of the grating structures 33 and 39 on the wafer 11.

Figure 2A:
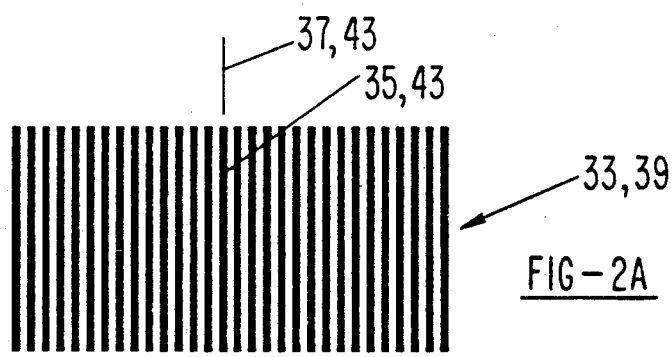
FIGS. 2A and 2B show an illustration of moire patterns as used in accordance with an embodiment of the invention.
Figure 2B:
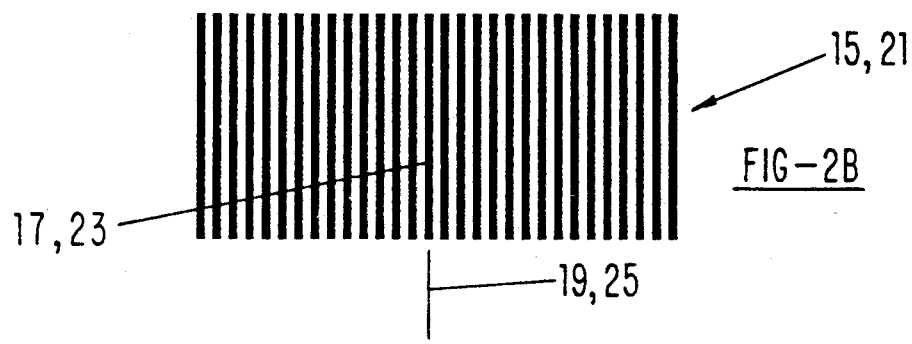

The grating structures 15 and 21 on the wafer or die 11 are located near the corner 14 correspondingly to grating structures 33 and 39 respectively on the reticle 27 near corner 31. The periodicity of the grating lines on the grating structures 15 and 21 on die 11 may be the same. And the periodicity of the grating lines on the structures 33 and 39 on reticle 27 may be the same. However, the periodicity of the grating lines on the grating structures 15 and 33 is slightly different, as is the periodicity of the grating lines of the structures 21 and 39. The difference in periodicity may be approximately 10% as shown in more detail in FIG. 2 although a rather broad range of percentage differential may be used. There, the lower grating lines for the die 11 indicated by the numerals 15, 21 are about 10% more spaced apart than the grating lines for the structures 33, 39 for the reticle 27. However, when the reticle 27 is in exact registration with the die 11 along both the x-axis and the y-axis, the centerlines 19 and 25 of the grating structures 15 and 21 respectively are in exact registration with the centerlines 37, 43 of respective grating structures 33, 39. That is, under the condition just described, when the die 11 and the reticle 27 are in exact registration or alignment, the circuit structures 13 and 29 and the centerlines of the grating structures on the reticle 27 exactly overlie the centerlines 17 and 23 of the grating structures on the die 11.

Figure 3A:
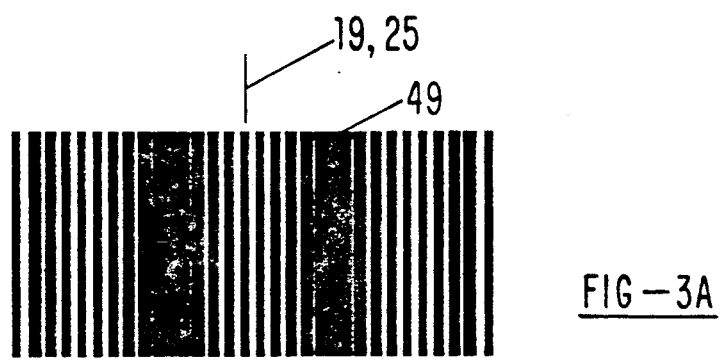
FIGS. 3A and 3B show an illustration of moire interference patterns.
Figure 3B:
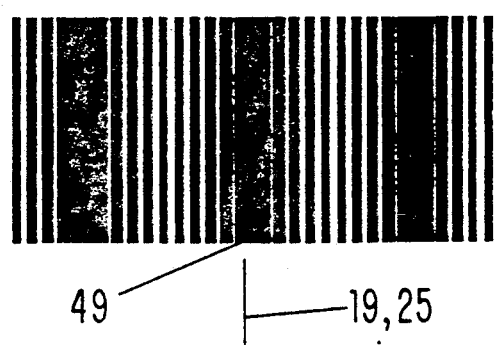
Figure 4A:
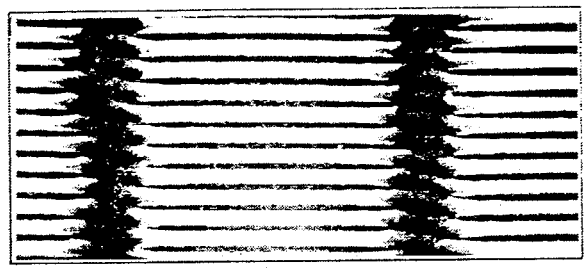
FIGS. 4A-4D show a reproduction of a photograph of moire fringes where moire patterns or gratings are tilted relative to each other.
Figure 4B:
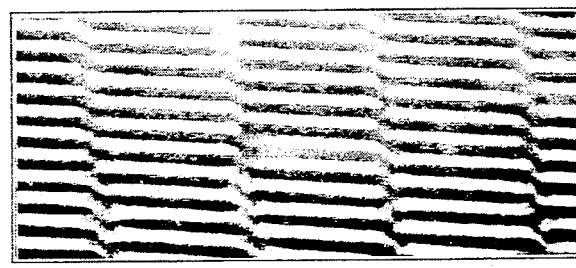
Figure 4C:
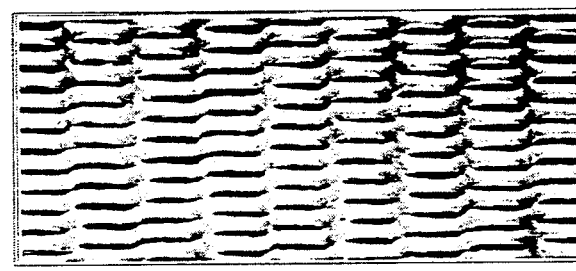
Figure 4D:
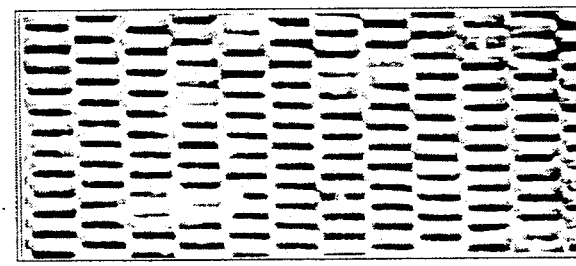
Figure 5A:
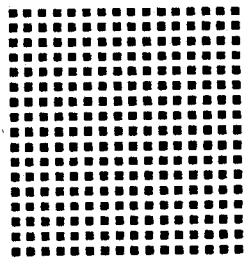
FIGS. 5A-5D show an illustration of grating structures and resulting moire fringes in accordance with another embodiment of the invention.
Figure 5B:
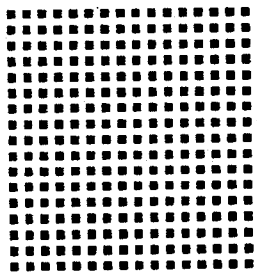
Figure 5C:
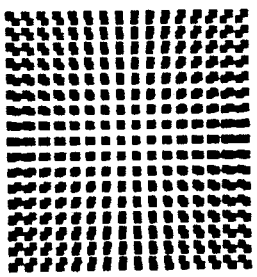
Figure 5D:
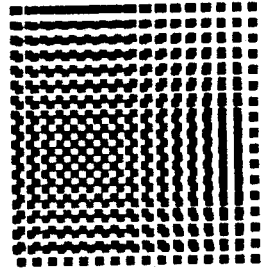

According to an embodiment of the invention, when a portion of the circuit structure 13 is applied to the wafer 11 through photolithography or any other suitable well known means, if the centerlines 35, 41 of the grating structures 33, 39 are exactly overlying centerlines 17, 23 of grating structures 15, 21, then a moire fringe pattern such as is shown in FIG. 3, pattern "A" will result from the deposition or development of material on, i.e., overlying, the grating structures 15, 21, or both. However, if the centerlines are not exactly overlying each other, then the moire fringe pattern of pattern "A" will be displaced, say, to the position shown in FIG. 3., pattern "B".

If the period difference between the centerlines 19 and 37 is, say, about 1 nm, moire fringes will oe produced with a period of about 5 mm and an initial period of about 340 nm. This multiplying effect of the moire fringes is shown in principle in FIG. 3. Inasmuch as the mathematical aspects of the effect of moire fringes in general are well known in the art, they will not be discussed in detail therein. The essential point in accordance with the invertion is that after the deposition or development is completed, the resultant moire fringe pattern can be observed and measured on the wafer structures 15 and 21 in the production cycle by any suitable well known means such as an electron or optical microscope.

Referring further to FIG. 3, if the fringe pattern is observed to be as shown in pattern "A" wherein, based on previous calibration and testing, it is seen that the centerline 19 of the grating structure 21 is in registration with the datum or center line 49 of the moire fringe (when there is no displacement), then a very accurate indication and measurement is provided indicating that the exposure of the lithographic pattern is correctly aligned.

If, however, as shown in pattern "B" there has been a displacement during the photolithographic development process, then the fact of such displacement or overlay will be evidenced by the displacement of the fringe line 49 from one of the centerlines 19 or 25. If there is displacement along both the x and y axes, then the fact of such displacement will be observable overlying both grating structures 15 and 21.

Instead of translational displacement, rotational displacement may occur. Rotational displacement or overlay may likewise be sensed in accordance with the invention using moire fringes. In particular, referring to FIG. 4., the fringe patterns which occur due to rotation or tilting of one grating structure with respect to the other, i.e., as between structures 21 and 39 for example, may be calibrated or calculated based on the percentage difference in the periodicity of the two grating structures. An example of this is shown in FIG. 4 showing photographs of four moire "tilt" fringe patterns. As shown, all of the patterns A-D shown in the Fig. are double exposure moire fringes at a wavelength of 488 nm in photoresist on Si of 340 nm period gratings with a relative tilt of 4.1 degrees for pattern "A" (f=4.7 μm), 9.8 degrees for pattern "B" (f-2.0 μm), 21 degrees for pattern "C" (f=0.95 μm) and 30.7 degrees (f=0.66 μm).

In another embodiment of the invention, both gratings on the reticle and on the wafer may be combined into a single bi-grating with periodicity in the directions of both the x and y axes. This is illustrated in FIG. 5 in which, for example, the die or wafer 11 may be provided with one grating structure 51 (instead of the two structures 15 and 21 shown in FIG. 1) comprising a series of square dots with a periodicity $p_1$ in both the x and y directions. Similarly, the reticle 27 may be provided with one grating structure 53 comprising a series of square dots having a periodicity $p_2$ in both the x and y directions, $p_2$ being, say, 5% greater than $p_1$. The pattern identified as "aligned" in FIG. 5 is the pattern which appears when the circuit structures and gratings 51 and 53 are in alignment. When, however, the gratings 51 and 53 are overlaid with a variation of ½ period in both the x and y directions, the pattern labeled "displaced" appears and is clearly markedly different from the "aligned" pattern. Any one of the dots may be used as the reference mark for the pattern in a marner similar to the use of the reference markers 19 and 25. Of course, the dots may be of any other suitable shape, srch as "Xs" (which will better indicate rotational displacement), polygons, or other shapes.

It should be understood that fringe patterns can be calculated and calibrated where both translation and rotation are occurring.

Consequently, in accordance with the invention there is provided an arrangement for very sensitive and precise measurement of overlay between two grating patterns. The phase of the difference fringe pattern relative to an external reference such as the centerline or grating mark (e.g., marks 19, 25, 37, 41) gives a direct measurement of the overlay. Clearly, a translation of a full period between the gratings will replicate or recycle the initial moire pattern. However, for a shift of ½ a grating period the phase of the much larger moire pattern will be varied by p/2 where p is the grating period. Thus, a heretofore difficult submicrometer measurement in accordance with the invention is transformed by the moire fringe arrangement is relatively straightforward optical measurement that is well within the capability of simple microscopy In addition, the periodicity of the resulting moire fringes provides a more sensitive focus measurement.

What is claimed is:

1. The method of measuring the relative displacement between submicron lithographic features on a wafer after lithographic exposure of the features on the wafer, said wafer having thereon a reference characteristic associated with a reference submicron grating structure of periodicity $p_1$ onto which there may be cast from a reticle the image of a projected submicron grating structure of periodicity $p_2$, the periodicity $p_2$ being sufficiently different from that of $p_1$ that at least a substantial portion of a moire fringe pattern between the two grating periods $p_1$ and $p_2$ is formed across the spatial extent of the grating structures when superimposed, comprising:
    a) measuring the extent of spatial change in the moire fringe pattern produced by the relative displacement of the two grating structures on the wafer, the extent of spatial change in the moire fringe pattern being greater than the extent of relative displacement of the two grating structures when superimposed, thereby providing for measurement purposes amplification of the actual extent of relative displacement of said two grating structures.

2. The method of claim 1 wherein the relative displacement is rotation.

3. The method of claim 1 wherein the first submicron grating structure is a bi-grating with with a periodicity $p_1$ in both a first direction and in a second direction at right angles to said first direction and the second submicron grating structure is a bi-grating with a periodicity $p_2$ different from $p_1$ in both a first direction and in a second direction at right angles to said first direction.

4. The method of claim 1 wherein the relative displacement is translation.

5. The method of claim 4 wherein the reference characteristic is a reference line aligned with a one of the lines in the reference submicron grating structure and the change in the moire fringe pattern is its displacement from said reference line.

6. The method of claim 5 wherein said one of the lines is essentially midway in said reference grating structure.

7. The method of claim 5 wherein each grating structure includes first and second groups of grating lines at essentially right angles to each other.

8. Apparatus for enabling the measurement of the relative displacement between the submicron lithographic features established on a wafer through the photolithographic projection of an image from a reticle comprising:
    a) a first submicron grating structure on said reticle having a periodicity $p_1$, and
    b) a second submicron grating structure on said wafer having a periodicity $p_2$ different from $p_1$ such that at least a substantial portion of a moire fringe pattern between the two grating periods is formed across the spatial extent of the grating structures when superimposed, whereby when the image on said reticle is projected is projected onto said wafer, a moire fringe is produced and, if there is displacement of the iamge from its desired position on the wafer, the moire fringe is changed in a manner and degree amplifying the extent to which the image is relatively displaced.

9. Apparatus according to claim 8 wherein said displacement is rotational

10. Apparatus according to claim 8 includign optical means for adjusting the periodicity $p_1$ of the first submicron grating structure when projected.

11. Apparatus according to claim 8 wherein the periodicity of the both grating structures in in two directions at right angles to each other.

12. Apparatus according to claim 8 wherein said displacement is translational.

13. Apparatus according to claim 12 wherein said apparatus further comprises:
    c. a reference mark adjacent said second submicron grating structure for providing a reference for measuring displacement of a characteristic of the moire fringe therefrom.

* * * * *

UNITED STATES PATENT AND TRADEMARK OFFICE
CERTIFICATE OF CORRECTION

PATENT NO.   : 5,216,257
DATED        : June 1, 1993
INVENTOR(S)  : Brueck et al.

It is certified that error appears in the above-identified patent and that said Letters Patent is hereby corrected as shown below:

Column 1, line 5, before "BACKGROUND" insert

-- Government Rights

The U.S. Government has a paid-up license in this invention and the right in limited circumstances to require the patent owner to license others on reasonable terms as provided for by the terms of Contract No. 91-MC0502 with Semiconductor Research Corporation/Semantech .--

Signed and Sealed this

Twenty-eighth Day of April, 1998

Attest:

BRUCE LEHMAN

Attesting Officer

Commissioner of Patents and Trademarks